United States Patent [19]
Hoang et al.

[11] Patent Number: 5,291,051
[45] Date of Patent: Mar. 1, 1994

[54] ESD PROTECTION FOR INPUTS REQUIRING OPERATION BEYOND SUPPLY VOLTAGES

[75] Inventors: Tuong H. Hoang, Sunnyvale; Mansour Izadinia, San Jose, both of Calif.

[73] Assignee: National Semiconductor Corporation, Santa Clara, Calif.

[21] Appl. No.: 943,913

[22] Filed: Sep. 11, 1992

[51] Int. Cl.⁵ ............ H01L 27/02; H01L 29/06; H01L 29/78
[52] U.S. Cl. ................ 257/360; 257/355; 257/356; 257/361; 257/378; 257/653; 361/91; 361/100; 361/101
[58] Field of Search ........... 257/355, 356, 360, 361, 257/378, 653; 361/91, 100, 101

[56] References Cited
U.S. PATENT DOCUMENTS

| | | |
|---|---|---|
| 4,633,283 | 12/1986 | Avery ............... 257/355 |
| 4,819,047 | 4/1989 | Gilfeather et al. ....... 257/378 |

FOREIGN PATENT DOCUMENTS

| | | | |
|---|---|---|---|
| 56-19656 | 2/1981 | Japan ............ 257/360 |
| 60-115253 | 6/1985 | Japan ............ 257/360 |
| 61-53761 | 3/1986 | Japan ............ 257/360 |

Primary Examiner—Ngan Ngo
Attorney, Agent, or Firm—Limbach & Limbach

[57] ABSTRACT

A circuit utilizable for protecting an integrated circuit feature from electrostatic discharge is disclosed. A first bipolar transistor has its emitter connected to the IC feature and its collector connected to ground. A second bipolar transistor has its emitter connected to the IC feature and its collector connected to its base and to the base of the first bipolar transistor. A field effect transistor has its gate and drain connected to the IC feature and its body connected to its source and to the collector and base of the second bipolar transistor and to the base of the first bipolar transistor. A diode has its cathode connected to the body and the source of the field effect transistor and to the collector and base of the second bipolar transistor and to the base of the first bipolar transistor.

5 Claims, 4 Drawing Sheets

ESD PROTECTION FOR INPUTS REQUIRING OPERATION BEYOND SUPPLY VOLTAGES

FIELD OF THE INVENTION

The present invention relates generally to protection circuits and, more specifically, to circuitry which protects against electrostatic discharge (ESD) in an integrated circuit.

BACKGROUND

Electrostatic discharge (ESD) in semiconductor integrated circuits (IC's) is a well-known problem. The inadvertent presence of a sudden voltage spike in an IC can cause physical destruction of IC features. For example, ESD-induced spikes can rupture the thin gate oxide of a field effect transistor (FET), or simply degrade the p-n junction of a semiconductor device, effectively destroying proper IC operation.

There are three basic models for simulating the effects of ESD events on semiconductor devices: the human body model, the machine model, and the charged device model. These models can be used to construct testers to quantify the resistance of devices to ESD events, and to model the effectiveness of a proposed ESD protection circuit using standard circuit simulation techniques.

The human body model is intended to simulate the effect of human handling on semiconductor devices. In FIG. 1, the capacitance C1 simulates the capacitance of the human body and is generally chosen to be 100 pf. The resistance R1 simulates the series resistance of the human body and is usually modeled as 1.5 KΩ. The capacitor C1 is charged to an initial voltage V1 and then discharged into the device under test (DUT). Devices which can withstand precharge voltages on the order of 2 to 3 Kev are considered acceptable by industry standards. A widely followed standard for testing according to the human body model is presented in MIL-STD-883C, notice 8, method 3015.7, "Electrical Discharge Sensitivity Test" (1989).

The machine model or "zero ohms" model utilizes the circuit of FIG. 1, except that C1 is 200 pf and R1 approximates "zero ohms." In a practical construction, R1 is in the range of 20 to 40 ohms. The discharge time constant of the machine model is much less than the human body model, and parasitic circuit components have more influence over the maximum current and voltage seen by the DUT during the discharge. A device that can withstand 400 volts is considered acceptable by industry standards. This model is commonly used in Japan and is covered in EIAJ Standards of the Electronic Industries association of Japan,, IC-121 Book 2 (1988).

The charged device model is used to simulate the ESD failure mechanisms associated with machine handling during the packaging and test of semiconductor devices. According to this model, an IC package is charged to a potential (100 volts to 2000 volts) by triboelectricity or by the presence of large electric fields. Then, the device is discharged to ground via any of the device pins. The charging is normally done via the substrate pin and the discharge is initiated by touching a device pin with a grounded low inductance probe. The time constant for this discharge process is less than 150 ps, and the discharged energy depends on the package capacitance.

A conventional input protection network is illustrated in FIG. 2. When the polarity of the ESD stress is negative with respect to ground, diode D2 becomes forward biased. As long as the diode series resistance is low enough, voltages seen by the circuit remain low enough to minimize on chip power dissipation and protect the CMOS gate oxide. For example, the human body model charged to 3 KeV corresponds to an instantaneous current of 2 amps. Therefore, the diode series resistance should be no more than 4 ohms in order to keep total voltage seen by the circuit to 8 volts, corresponding to the worst case breakdown for a 10 nm gate oxide typical of a 0.5 μm CMOS process.

When the ESD stress is positive with respect to ground, there are two possibilities for current flow. First, diode D2 charges up until it reaches reverse breakdown, at which point the rise in voltage at the input tends to be clamped. Unfortunately, the reverse breakdown for D2 may be higher than the gate oxide breakdown, thus allowing voltages damaging to input or output device buffers to pass. Second, diode D1 becomes forward biased and begins to charge up Vcc until some breakdown mechanism on the die, such as parasitic field turn-on, gate oxide breakdown, or latchup, clamps the rise in Vcc. It is this mechanism that causes failures internal to the die during ESD stress.

A problem with conventional ESD solutions is that many IC's require inputs to be at voltage levels well above the positive supply voltage or below ground potential. The conventional solutions clamp the input voltage at a diode drop above Vcc or below ground. Clearly this is unacceptable when the magnitude of the input voltage is above Vcc or below ground. Thus, it is desirable to have an ESD protection circuit that is able to dissipate ESD stress from such inputs.

SUMMARY OF THE INVENTION

An integrated circuit device utilizable for protecting an integrated circuit feature from damage due to electrostatic discharge is disclosed. A first bipolar transistor has its emitter connected to the IC feature and its collector connected to ground. A second bipolar transistor has its emitter connected to the IC feature and its collector connected to its base and to the base of the first bipolar transistor. A field effect transistor has its gate and drain connected to the IC feature and its body connected to its source and to the collector and base of the second bipolar transistor and to the base of the first bipolar transistor. A diode has its cathode connected to the body and source of the field effect transistor and to the collector and base of the second bipolar transistor and to the base of the first bipolar transistor.

In the preferred construction of the device, a P type substrate has a first well of N type material formed in a portion of the substrate. A second well of P+ type material is formed in a central portion of the first well. A third well of P+ type material is formed in the first well and surrounds the second well. The third well is separated from the second well by a portion of the first well. A fourth well of N+ type material is formed in the interface between the first well and the substrate and surrounds the third well. The fourth well is separated from the third well by a portion of the first well. A fifth well of P+ type material is formed in the substrate and surrounds the fourth well. The fifth well is separated from the fourth well by a portion of the substrate.

An oxide layer overlies the substrate, including the first through fifth wells. A first interconnect is located within the oxide layer and contacts the fifth well. A second interconnect is located within the oxide layer and contacts the third and the fourth wells. A third interconnect is located within the oxide layer and contacts the second well. A fourth interconnect overlies the oxide layer and contacts the third interconnect.

The second well forms the emitter region for the first bipolar transistor. The first well and the fourth well form the base region for the first bipolar transistor. The fifth well and the substrate form the collector region for the first bipolar transistor. The second well forms the emitter region for the second bipolar transistor. The first well and the fourth well form the base region for the second bipolar transistor. The third well forms the collector region for the second bipolar transistor. The second well forms the drain region for the field effect transistor. The third well forms the source region for the field effect transistor. The third interconnect forms the gate for the field effect transistor. The fourth well forms the cathode for the diode. The substrate forms the anode for the diode.

A better understanding of the features and advantages of the present invention will be obtained by reference to the following detailed description of the invention and accompanying drawings which set forth an illustrative embodiment in which the principles of the invention are utilized.

DETAILED DESCRIPTION OF THE INVENTION

Figure 1:
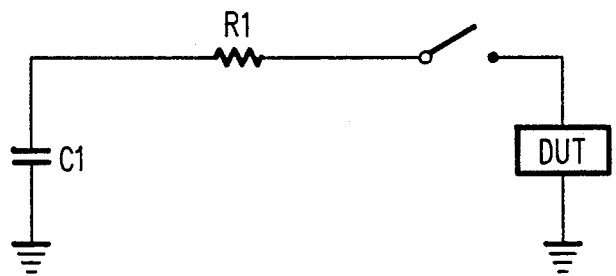
FIG. 1 is a circuit schematic for an ESD testing technique.
Figure 2:
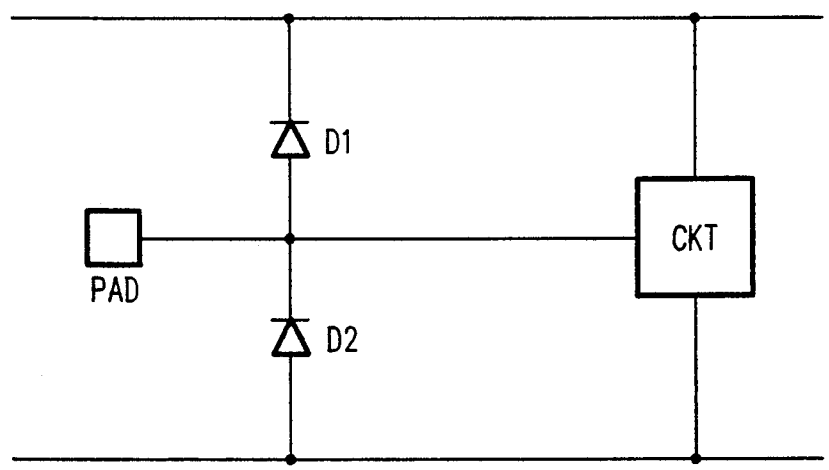
FIG. 2 is a circuit schematic of a conventional ESD protection circuit.
Figure 3:
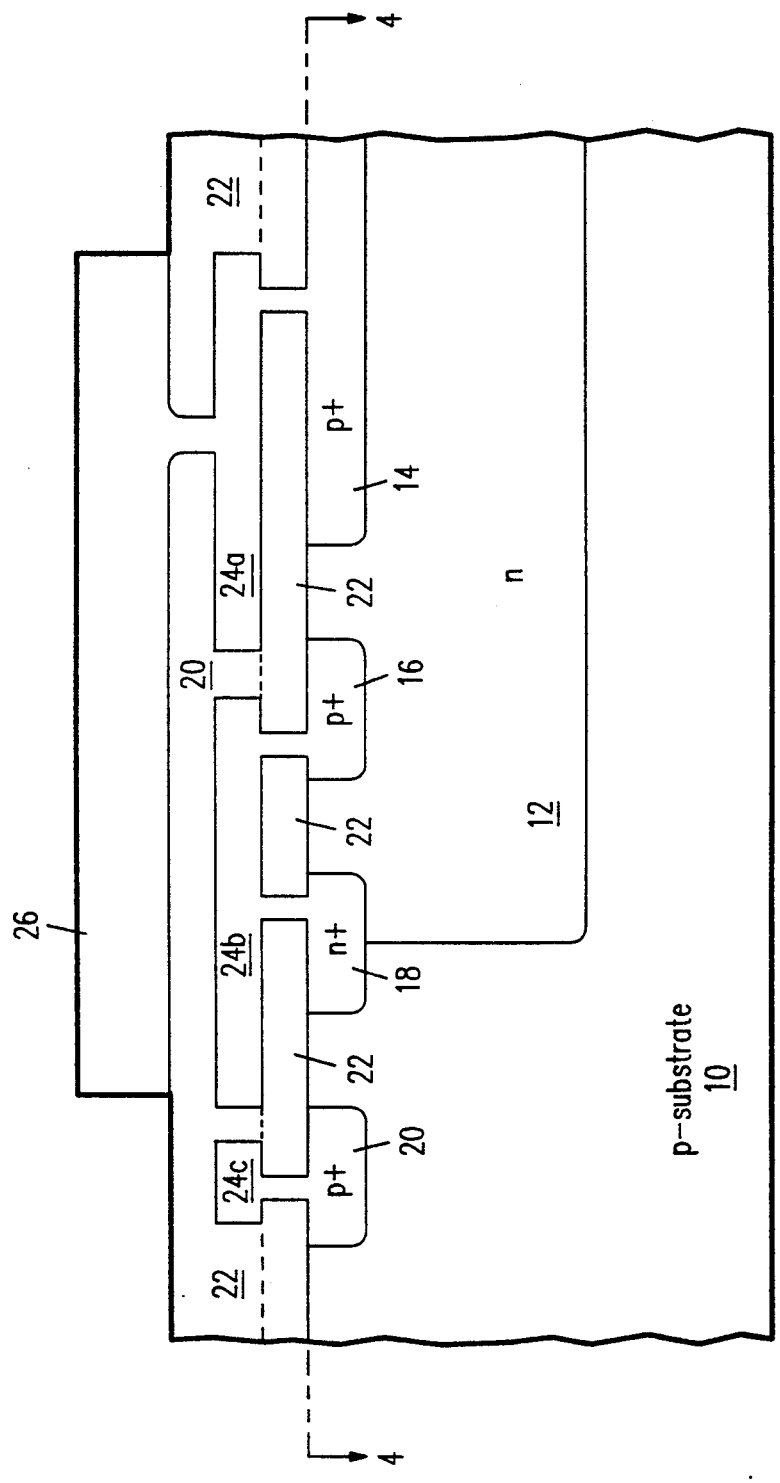
FIG. 3 is a side plan sectional view of a semiconductor device fabricated in accordance with the present invention taken across section 3—3 of FIG. 4.

Referring now to FIG. 3, a sectional portion of a semiconductor integrated circuit having a P substrate 10 is illustrated. An N well 12 is formed relatively deep into the substrate 10 to a depth of approximately 3.5 microns. A first P+ well 14 is formed in a central portion of the deep N well 12 to a depth of approximately 0.4 microns. A second P+ well 16 is also formed in a central portion of the deep N well 12 to a depth of approximately 0.4 microns. An N+ well 18 is formed on the vertical interface between the deep N well 12 and the substrate 10 to a depth of approximately 0.4 microns. A third P+ well 20 is formed in the substrate 10 to a depth of approximately 0.4 microns.

An oxide layer 22 insulates the active regions of the device and is formed in two deposition steps with a first metal layer 24 being formed between the two oxide depositions. Metal interconnect 24a contacts the first P+ well 14. Metal interconnect 24b contacts both the second P+ well 16 and the N+ well 18. Metal interconnect 24c contacts the third P+ well 20. A second metal layer 26 overlies the oxide layer 22 and contacts interconnect 24a. The second metal layer 26 is the input contact.

Figure 4:
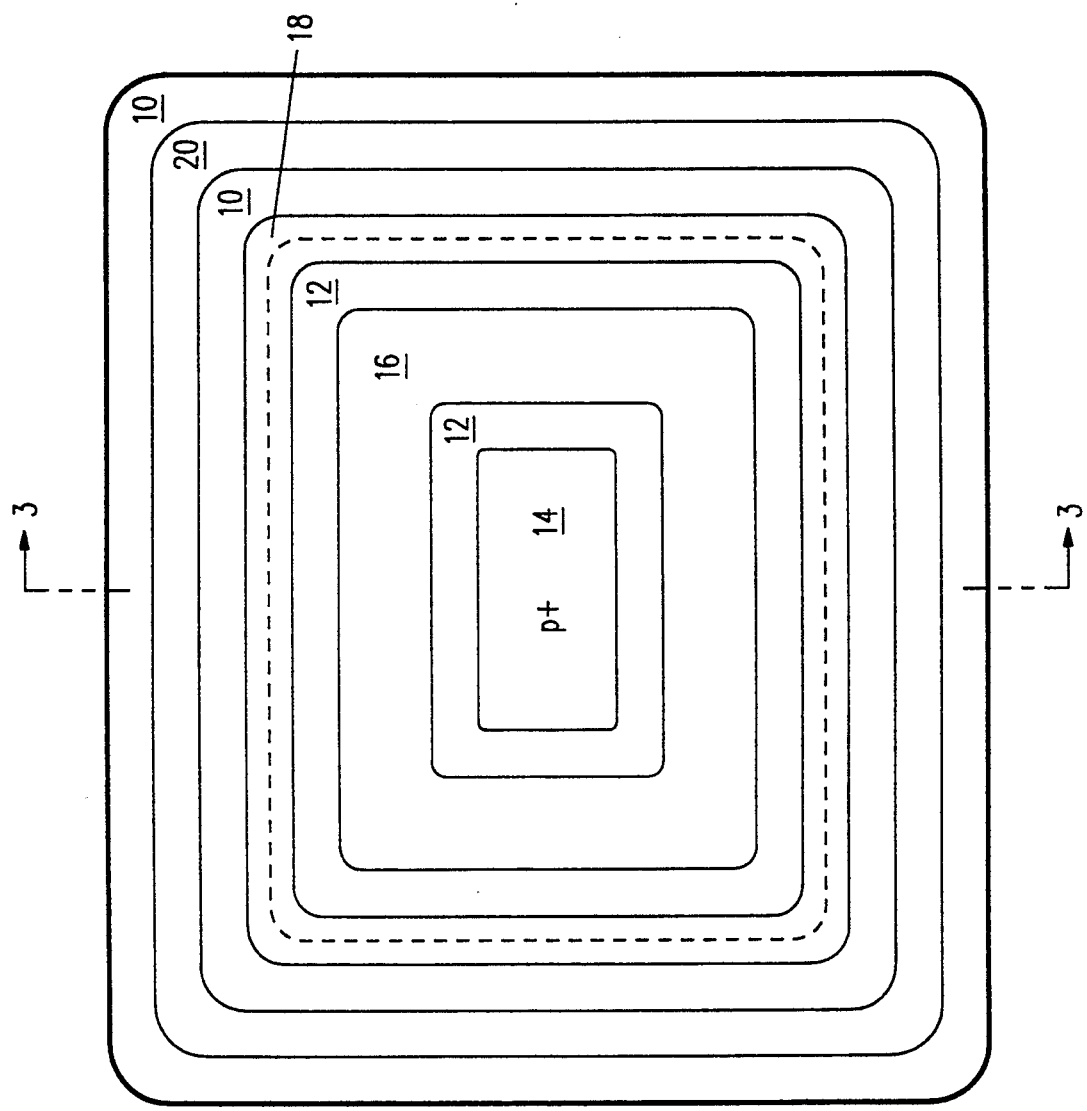
FIG. 4 is a top plan view of a semiconductor device taken across section 4—4 of FIG. 3.

A plan view of the device is taken across section 4—4 and is illustrated in FIG. 4. Further, it is noted that the view of FIG. 3 is taken across the section 3—3 of FIG. 4.

It can be seen in FIG. 4 that the P+ well 16 surrounds the P+ well 14 but is separated therefrom by the N well 12. Further, the N+ well 18 surrounds the P+ well 16 but is separated therefrom by the N well 12. Note that the N well 12 overlaps the N+ well 18, as shown by cross hatching in the Figure. Finally, the P+ well 20 surrounds the N+ well 18 but is separated therefrom by the substrate 10.

Figure 5:
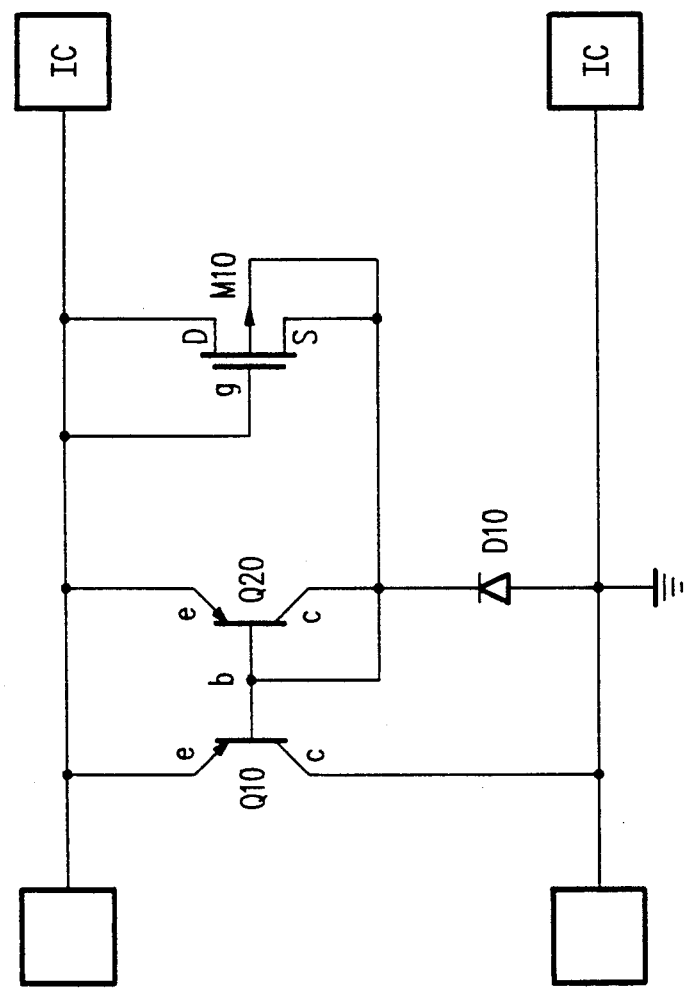
FIG. 5 is a circuit schematic diagram of the device of FIG. 3.

The corresponding circuit diagram is illustrated in FIG. 5. In order to realize the PNP bipolar transistor Q10, the P+ well 14 is the emitter, the N+ well 18 and n well 12 form the base, and the P+ well 20 and the substrate 10 form the collector. In order to realize the PNP bipolar transistor Q20, the P+ well 14 is the emitter, the N+ well 18 and n well 12 form the base, and the P+ well 16 is the collector. Note that the base of transistor Q20 (N+ well 18) is electrically connected to the collector (P+ well 16) of transistor Q20 by metal interconnect 24b, and both the base and collector are floating. MOSFET M10 is realized by using P+ well 14 as the drain; the source of MOSFET 10 is realized through P+ well 16, and its gate corresponds to metal interconnect 24a. The junction between the N+ well 18 in conjunction with the n well 12 and the P substrate 10 corresponds to the diode D10.

When a positive-going ESD pulse hits the IC input as realized by metal layer 26, the P+ well 14 forward biases into the N well 12. However, since the N well 12 is floating, the voltage therein will rise until the junction between N+ well 18 and the P substrate 10 breaks down, thereby conducting the ESD pulse to the P substrate 10 (ground).

The positive ESD pulse on the P channel metal gate 24a causes the N well 12 to be in accumulation in the channel region of MOSFET M10 between P+ well 16 and P+ well 14, thus reducing the parasitic resistance of the device. However, since the N well 12 is broken down into the substrate, the heat dissipating area is relatively large, namely the entire area of the N well 12.

When a negative-going ESD pulse hits, the P substrate 10 and the N well 12 become forward biased. Then, the junction between the N well 12 and the P+ well 14, which is tied to the input 26, breaks down. However, in this case the heat dissipating area is small, namely the area of P+ well 14, therefore parasitic resistance must be minimized. This is accomplished via the metal gate MOSFET M10.

When the metal gate input 26 drops below ground by about 15 volts, the MOSFET M10 turns on. This causes the N well 12 to be inverted, thereby forming a conductive channel between the P+ well 14 (drain) and the P+ well 16 (source). This reduces the resistance of the N well 12, effectively bypassing the N well 12. Reduction of resistance to the input reduces heat dissipation in the structure. Also, the MOSFET M10 increases input capacitance, thereby tending to lower the peak voltage internal to the device. This structure has worked particularly well in the zero ohm model.

It should be understood that the invention is not intended to be limited by the specifics of the above-described embodiment, but rather defined by the accompanying claims.

We claim;

1. A circuit utilizable for protecting an integrated circuit from damage due to a power spike, comprising:
   a first bipolar transistor having its emitter connected to the integrated circuit and its collector connected to ground;
   a second bipolar transistor having its emitter connected to the integrated circuit and its collector connected to its base and to a base of the first bipolar transistor;
   a field effect transistor having its gate and drain connected to the integrated circuit and its substrate connected to its source and to the collector and base of the second bipolar transistor and to the base of the first bipolar transistor; and
   a diode having its cathode connected to the substrate and the source of the field effect transistor and to the collector and base of the second bipolar transistor and to the base of the first bipolar transistor.

2. A circuit according to claim 1, wherein the first and second bipolar transistors are PNP bipolar transistors, and wherein the field effect transistor is a P channel MOSFET.

3. A circuit according to claim 2, comprising:
   a substrate of P type material;
   a first well of N type material formed in a portion of the substrate;
   a second well of P+ type material formed in a central portion of the first well;
   a third well of P+ type material formed in the first well and surrounding the second well and separated therefrom by a portion of the first well;
   a fourth well of N+ type material formed in an interface between the first well and the substrate and surrounding the third well and separated therefrom by a portion of the first well;
   a fifth well of P+ type material formed in the substrate and surrounding the fourth well and separated therefrom by a portion of the substrate;
   a dielectric layer overlying the substrate and first through fifth wells;
   a first interconnect within the dielectric layer and contacting the fifth well;
   a second interconnect within the dielectric layer and contacting both the fourth well and the third well;
   a third interconnect within the dielectric layer and contacting the second well; and
   a fourth interconnect overlying the dielectric layer and contacting the third interconnect,
   wherein the second well forms the emitter for the first bipolar transistor, the first well and the fourth well form the base for the first bipolar transistor, the fifth well and the substrate form the collector for the first bipolar transistor, the second well forms the emitter for the second bipolar transistor, the first well and the fourth well form the base for the second bipolar transistor, the third well forms the collector for the second bipolar transistor, the second well forms the drain for the field effect transistor, the third well forms the source for the field effect transistor, the third interconnect forms the gate for the field effect transistor, the fourth well forms the cathode for the diode, and the substrate forms an anode for the diode.

4. A semiconductor device utilizable for protecting an integrated circuit from damage due to a power spike, comprising:
   a substrate of first conductivity-type material;
   a first well of second conductivity-type material formed in a portion of the substrate;
   a second well of first conductivity-type material formed in a central portion of the first well;
   a third well of first conductivity-type material formed in the first well and surrounding the second well but separated therefrom by a portion of the first well;
   a fourth well of second conductivity-type material formed in an interface between the first well and the substrate and surrounding the third well but separated therefrom by a portion of the first well;
   a fifth well of first conductivity-type material formed in the substrate and surrounding the fourth well but separated therefrom by a portion of the substrate;
   an oxide layer overlying the substrate and the first through fifth wells;
   a first interconnect formed within the oxide layer and in electrical contact with the fifth well;
   a second interconnect formed within the oxide layer and in electrical contact with the third and the fourth well;
   a third interconnect formed within the oxide layer and in electrical contact with the second well; and
   a fourth interconnect overlying the oxide layer and in electrical contact with the third interconnect,
   wherein the second well forms an emitter region for a first bipolar transistor, the first well and the fourth well form a base region for the first bipolar transistor, the fifth well and the substrate form a collector region for the first bipolar transistor, the second well forms an emitter region for a second bipolar transistor, the first well and the fourth well form a base region for the second bipolar transistor, the third well forms a collector region for the second bipolar transistor, the second well forms a drain region for a field effect transistor, the third well forms a source region for the field effect transistor, the third interconnect forms a gate for the field effect transistor, the fourth well forms a cathode for a diode, and the substrate forms an anode for the diode, whereby a power spike is dissipated by the device.

5. A semiconductor device utilizable for protecting an integrated circuit from electrostatic discharge, comprising:
   a substrate of P type material;
   a first well of N type material formed in a portion of the substrate;
   a second well of P+ type material formed in a central portion of the N type well;
   a third well of P+ type material formed in the first well and surrounding the second well and separated therefrom by a portion of the first well;
   a fourth well of N+ type material formed in an interface between the first well and the substrate and surrounding the third well and separated therefrom by a portion of the first well;
   a fifth well of P+ type material formed in the substrate and surrounding the fourth well and separated therefrom by a portion of the substrate;
   a dielectric layer overlying the substrate and the first through fifth wells;
   a first interconnect within the dielectric layer and contacting the fifth well;
   a second interconnect within the dielectric layer and contacting both the fourth well and the third well;

a third interconnect within the dielectric layer and contacting the second well; and a fourth interconnect overlying the dielectric layer and contacting the third interconnect, wherein the second well forms an emitter region for a first bipolar transistor, the first well and the fourth well form a base region for the first bipolar transistor, the fifth well and the substrate form a collector region for the first bipolar transistor, the second well forms an emitter region for a second bipolar transistor, the first well and the fourth well form a base region for the second bipolar transistor, the third well forms a collector region for the second bipolar transistor, the second well forms a drain region for a field effect transistor, the third well forms a source region for the field effect transistor, the third interconnect forms a gate for the field effect transistor, the fourth well forms a cathode for a diode, and the substrate forms an anode for the diode, whereby a power spike is dissipated by the device.

* * * * *